(12) United States Patent
Halamik et al.

(10) Patent No.: US 6,271,735 B1
(45) Date of Patent: Aug. 7, 2001

(54) OSCILLATOR CONTROLLER WITH FIRST AND SECOND VOLTAGE REFERENCE

(75) Inventors: Josef Halamik, Roznov p.R.; Frantisek Sukup, Rosnov p.R., both of (CS); Jefferson W. Hall, Phoenix, AZ (US)

(73) Assignee: Semiconductor Components Industries, LLC., Phoenix, AZ (US)

( * ) Notice: Subject to any disclaimer, the term of this patent is extended or adjusted under 35 U.S.C. 154(b) by 0 days.

(21) Appl. No.: 09/455,416

(22) Filed: Dec. 6, 1999

(51) Int. Cl.[7] .............................. H03B 5/20; H01B 5/24; H03K 3/023
(52) U.S. Cl. .................... 331/111; 331/143; 331/185; 331/175
(58) Field of Search ........................ 331/111, 143, 331/175, 185, 177 R, 186, 177 V

(56) References Cited

U.S. PATENT DOCUMENTS

| | | | |
|---|---|---|---|
| 4,260,959 | * 4/1981 | Allgood | 331/111 |
| 4,359,649 | * 11/1982 | Mündel | 307/268 |
| 4,365,212 | * 12/1982 | Gentile et al. | 331/111 |
| 5,614,872 | * 3/1997 | Tagiri | 331/143 |

* cited by examiner

Primary Examiner—David Mis
(74) Attorney, Agent, or Firm—Robert D. Atkins; Michael T. Wallace

(57) ABSTRACT

A controller oscillator provides a periodic output signal having first and second output level states. The oscillator is responsive to an applied saw tooth signal that varies between first and second voltages ($V_{low}$, $V_{high}$). The oscillator is comprised of a comparator (82) the non-inverting input of which receives the saw tooth signal applied thereto to produce the periodic output signal at its output (86). A first voltage reference circuit (88, 90, and 92) generates the second voltage ($V_{high}$) that is applied to the inverting input of the comparator while the periodic output signal is at the first output level state and the input signal charges from the first voltage ($V_{low}$) towards the second voltage. As the input signal becomes equal to the second voltage the output of the comparator switches to the second output level state and a second voltage reference (92, 94, 96) provides the first voltage at the inverting input of the comparator.

7 Claims, 4 Drawing Sheets

OSCILLATOR CONTROLLER WITH FIRST AND SECOND VOLTAGE REFERENCE

BACKGROUND OF THE INVENTION

The present invention, in general, relates to reference oscillators for supplying periodic output signals and, more articularly, to a method and oscillator system for providing accurate output pulses for use in fixed frequency systems for example.

Fixed frequency Switching Mode Power Supply (SMPS) systems contain an oscillator subsystem that drives the system with an accurate periodic output signal. The accuracy of the oscillator dictates the performance of the whole SMPS system. Typically, prior art oscillator subsystems, in order to obtain oscillator accuracy requirements, have been very complex requiring high component count and die area when manufactured in monolithic integrated circuit form. The foregoing is directly proportional to the system costs. Additionally, these controller oscillator systems are responsive to an internally generated saw tooth signal that charges and discharges between high and low voltage references. The accuracy of the oscillator output signal is therefore a function of the accuracy of these two voltage references over temperature and circuit process variations.

Hence, a need exists for a relatively inexpensive oscillator subsystem while maintaining accurate system parameters.

DETAILED DESCRIPTION OF THE DRAWINGS

Figure 1:
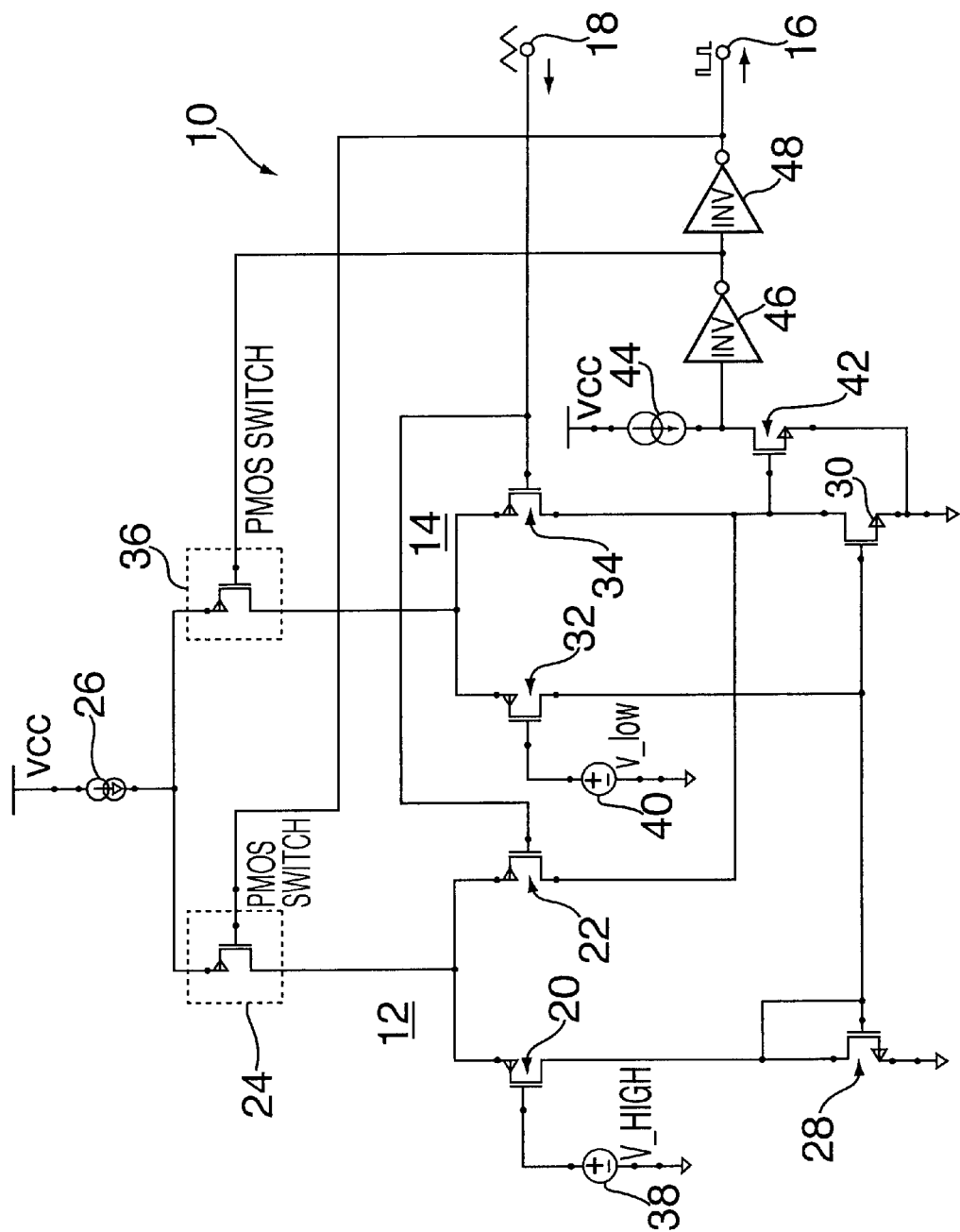
FIG. 1 is a schematic diagram of a prior art controller oscillator.

Turning to FIG. 1, there is illustrated prior art controller oscillator 10 that is suited for use in integrated Switching Mode Power Supply (SMPS) systems. Oscillator 10 comprises a pair of comparators 12 and 14 for producing periodic or pulse signals at an output 16 thereof as will be described. The pulse output signals are generated in response to a saw tooth input signal being applied to the input 18 of reference oscillator 12. As understood, the output of oscillator 10 can be utilized in generating the saw tooth input signal.

First comparator 12 includes a pair of differentially connected PMOS transistors 20 and 22, the source electrodes of which are commonly coupled to switch 24. The drain of transistor 20 is coupled to the drain and gate of NMOS transistor 28 with the source of the latter being connected to a ground reference. The drain of transistor 22 is connected to the drain of NMOS transistor 30 the gate and source of which are connected to the gate of transistor 28 and ground reference respectively. One input of comparator 12, the gate of transistor 20, receives a fixed voltage from voltage generator 38, which, as will be described, is the high reference voltage for oscillator 10. Similarly, the other input of comparator 12, the gate of transistor 22 is connected to input 18 and receives the saw tooth input signal.

Likewise, comparator 14 includes a pair of differentially connected PMOS transistors 32 and 34 the source electrodes of which are commonly connected to switch 36. The drain of transistor 32 is shown as being connected to the gate of transistor 30 while the drain of transistor 34 is connected to the drain of transistor 30. The gate of transistor 32 is coupled to voltage generator 40 which sets the gate to a fixed voltage, which is the low reference for oscillator 10 while the gate of transistor 34 is connected to input 18 at which is received the saw tooth input signal. Switch 24 and 36 may be realized by a pair of PMOS transistors; the drains of which are respectively coupled to the source electrodes of commonly connected transistors 20,22 and 32,34. The source electrodes of transistors 24 and 36 are connected to Vcc via current source 26. The gate of transistor 24 is coupled to output 16 while that of transistor 36 is coupled to the output of inverter 46 and to the input of inverter 48, the output of the latter being coupled to output 16. Finally, an inverter stage composed of NMOS transistor 42 is provided which has its gate coupled to the drain of transistor 30 while its drain is coupled both to the input of inverter 46 and Vcc via current source 44. The source of transistor 42 is returned to ground reference.

In operation, only one of the comparators 12 or 14 is operative at any given time since respective switches 24 and 36 are never closed at the same time, i.e., if the output signal at output 16 is high, switch 24 is open and switch 36 is closed. Thus, current is supplied to comparator 14 as transistor 36 is turned on rendering comparator 14 operative while comparator 12 is kept non-operative; the opposite is true when output 16 is driven low.

Thus, whenever the saw tooth signal applied at input 18 is charging from $V_{low}$ towards $V_{high}$, comparator 12 is rendered operative while comparator 14 is inoperative. Hence the output signal at output 16 remains in a low state as transistor 22 is turned on. This causes transistor 42 to be conductive thus placing a logic zero at the input of inverter 46. Hence, the output signal is at the aforedescribed low state. Once the level of the saw tooth input signal reaches the value of $V_{high}$ the output logic state at output 16 will be forced to a logic one state. This results due to transistors 20 and 22 conducting equally which in turn turns on transistor 30 to force the drain of transistor 42 (the input of inverter 46) to a high logic state. The logic level state at output 16 follows the logic level state at the input of inverter 46 and thus goes to a high logic level state while the output of inverter 46, having a connection to the gate of transistor 36, goes to a low logic level state. Comparator 12 therefor immediately becomes inoperative as switch/transistor 24 is opened, transistor 24 becoming non-conductive while switch/transistor 36 is turned on to render comparator 14 operative. The saw tooth signal at input 18 will then begin to discharge from the magnitude, $V_{high}$, towards $V_{low}$.

The saw tooth signal will continue to discharge as long as its magnitude is greater than $V_{low}$. In this state, transistor 32 is more conductive than transistor 34 which maintains transistor 30 turned on to keep the output signal from oscillator 10 at output 16 in a high logic level state. Once, the magnitude of the saw tooth signal reaches the magnitude $V_{low}$ the output logic state at output 16 changes to a logic zero and the saw tooth signal begins to charge again repeating the above described action.

Hence, as the applied input saw tooth signal charges and discharges between the two reference voltages $V_{high}$ and $V_{low}$, prior art oscillator 10 provides a repetitive periodic signal at its output.

Although oscillator 10 can be integrated in monolithic integrated circuit form, it suffers from its complexity. Oscillator 10 occupies a lot of silicon area as it requires two comparators and two reference voltage sources together with auxiliary switching circuitry.

Figure 2:
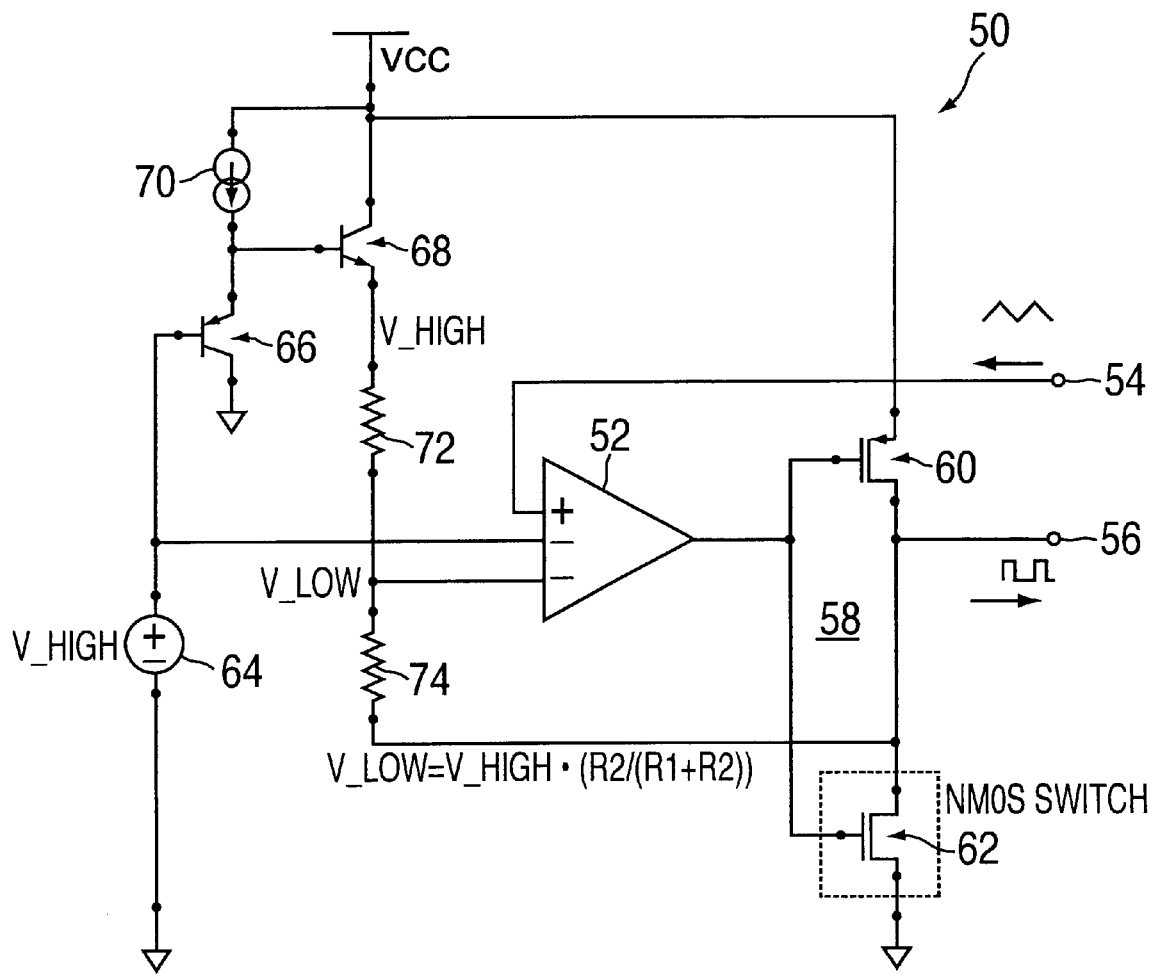
FIG. 2 is a schematic diagram of another prior art controller oscillator.

Turning to FIG. 2 there is show prior art oscillator 50 which is also suited as use in integrated SMPS systems. Although oscillator 50 is not as complex as oscillator 10 and therefor requires less silicon die area in monolithic integrated circuit form than the former, it suffers from other disadvantages to be described.

Oscillator 50 utilizes a window comparator 52 having two threshold voltages, $V_{high}$ and $V_{low}$ and reference and switching circuitry. The saw tooth wave input signal is applied at input 54 to the non-inverting input of comparator 52 while the $V_{high}$ and $V_{low}$ reference voltages are applied to first and second inverting inputs of comparator 52. The output of comparator 52 produces a periodic signal at output 56 having first and second logic level states as described above in relation to oscillator 10. The output of comparator 52 directly drives the inverter/switching stage 58, the latter of which includes PMOS transistor 60 and NMOS switching transistor 62. The high voltage reference $V_{high}$ is established directly by single voltage reference generator 64 coupled to the first inverting input of comparator 52. PNP voltage shifting transistor 66, NPN voltage shifting transistor 68 along with associated current source 70 substantially place the voltage reference, $V_{high}$, at the top of a resistive divider network comprising serially connected resistors 72 and 74. As the node connecting resistors 72 and 74 is connected to the second inverting input of comparator 52, a low voltage reference potential, $V_{low}$, is established thereat which is substantially equal to:

$$V_{low} = V_{high}\left(\frac{R74}{R72+R74}\right) \quad (1)$$

where R72 and R74 are the resistance values of resistors 72 and 74 respectively.

Hence, oscillator 50 requires a single voltage generator to produce the upper and lower voltage threshold whereas oscillator 10 required two voltage generators. Additionally, oscillator 50 requires fewer components and silicon die area to be realized in integrated circuit form with respect to oscillator 10 as it is significantly less complex than oscillator 10. However, oscillator 50 also suffers from several disadvantages if it is realized in integrated circuit form.

A major disadvantage of oscillator 50 is that its output frequency is not independent of operating temperature and process variations. The use of complementary voltage level shifter transistors make matching of the device characteristics' over process and temperature very difficult. Thus, the low voltage reference can vary which will cause the frequency of the oscillator to change. Also, the non-linearity properties of the resistor divider as well as the saturation characteristics of the NMOS switching transistor over temperature will contribute to the low reference voltage errors. Additionally, the subject oscillator still may require too much die are due to the large silicon area required for the layout of the resistors.

Figure 3B:
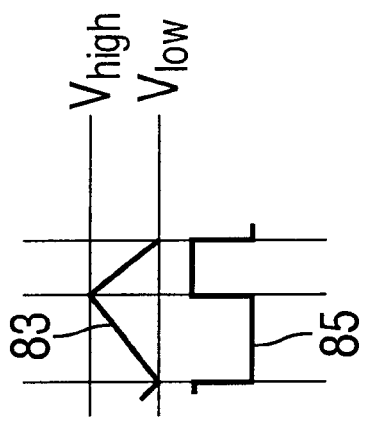
FIG. 3b, illustrates the timing of the applied input signal and the periodic output pulses of the controller oscillator of the present invention.
Figure 3A:
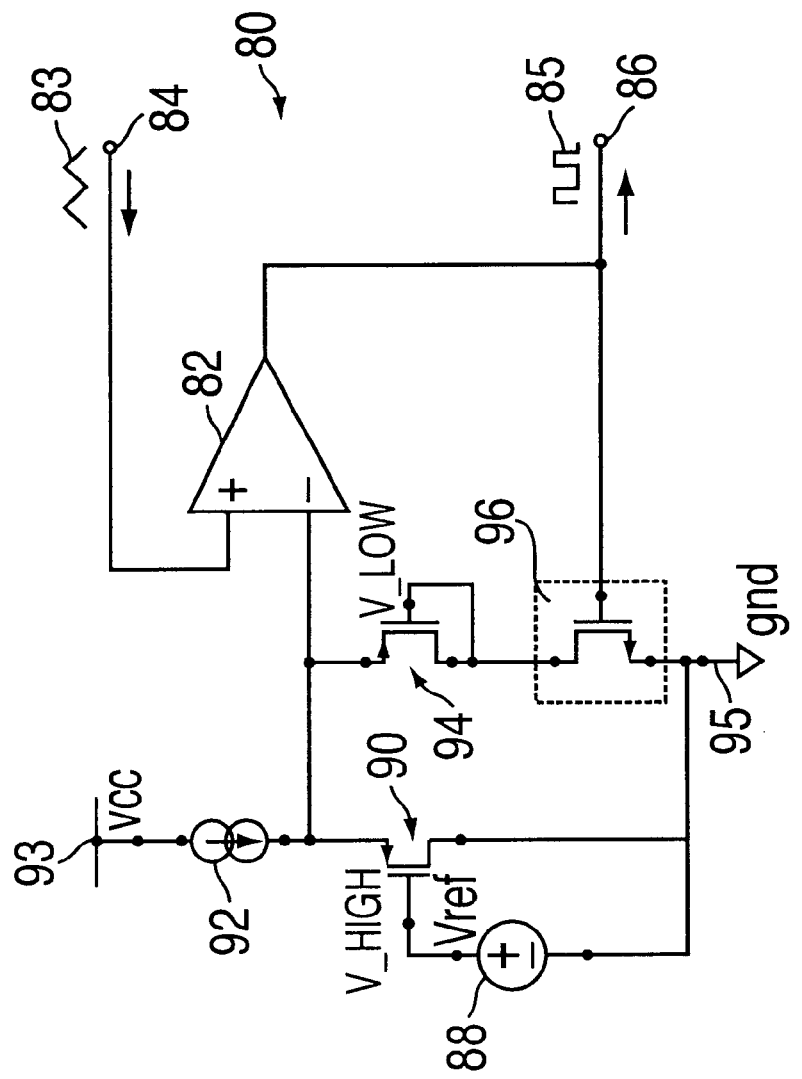
FIG. 3a, is a schematic diagram of the reference controller oscillator of the present invention.

Turning now to FIG. 3 a controller oscillator 80 of the present invention is shown that suffers not from the temperature and process deficiencies of the prior art and which requires minimum die area and is economical to fabricate.

Controller oscillator 80 includes a simple comparator 82 the non-inverting input of which is coupled to input 84 for receiving a saw tooth input signal 83 while its output is coupled to output 86 for providing a periodic output signal 85 having first and second logic level states as described above. A single voltage generator 88 providing a reference voltage, $V_{ref}$, is utilized which may be external to the integrated circuit encompassing controller oscillator 80. In this manner this reference voltage which is utilized to develop both $V_{high}$ and $V_{low}$ is independent of temperature and process variations. The output of voltage reference generator 88 is coupled to the gate electrode of PMOS transistor 90 while the source and drain electrodes of this transistor are coupled respectively to the inverting input of comparator 82 and terminal 95 at which is supplied a ground reference potential. A standard current source 92 has its output coupled to the source of transistor 90 and receives the operating potential $V_{cc}$ at terminal 93. A high reference voltage, $V_{high}$, is thus provided to the inverting input of comparator 82 that is voltage level shifted through transistor 90 and is equal to:

$$V_{high}=V_{ref}+V_{GS} \quad (2)$$

where $V_{GS}$ is the gate-to-source voltage of the PMOS transistor 90 operating at the current level supplied by current source 92. As long as the output of comparator 82 is in a low logic level state, the voltage supplied to the inverting input of comparator 82 is equal to $V_{high}$. However, whenever the output of comparator 82 goes to its high logic level state the reference voltage at the inverting input thereof will switch to the low reference potential of $V_{low}$. Hence, with the logic level at output 86 being in a high logic level state, NMOS switching transistor 96, the gate of which is coupled to the output of comparator 82, is turned on. This effectively shorts the gate and drain electrodes of level shift PMOS transistor 94 to ground reference as these two electrodes are connected to the drain of transistor 96. The low voltage reference voltage $V_{low}$ is therefore substantially equal to:

$$V_{low}=V_{GS} \quad (3)$$

where $V_{GS}$ is the gate-to-source voltage of PMOS transistor 94 operated at the current level supplied by current source 92. Thus, if transistors 90 and 94 are identical and are placed near each other in the integrated circuit, then their gate-to-source voltages will be substantially equal and will track with temperature and process variations. Hence, the difference between $V_{high}$ and $V_{low}$, equation (2)- equation (3) is $V_{ref}$, the voltage potential supplied by voltage generator 88, and is independent of temperature and circuit process variations.

Thus, in operation, with the output signal at output 86 being in a low logic level state, the inverting input of comparator is at $V_{high}$ and remains thereat as the saw tooth signal applied at input 84 charges or increases toward the value of $V_{high}$. Once the magnitude of the saw tooth input signal reaches $V_{high}$ the output of comparator 82 switches to the high output logic level state. The voltage reference at the inverting input of comparator 82 is therefore immediately changed in magnitude to $V_{low}$ while the saw tooth signal begins discharging or decreasing towards this voltage reference. When the magnitude of the saw tooth signal reaches $V_{low}$ the output of comparator 82 switches to the high logic level state and the aforedescribed action is repeated.

The controller oscillator 80 is much less complex than the prior art while at the same time provides accurate output pulses that are independent of temperature and process variations. For example, the single voltage reference generator 88 can be supplied "off chip" and is not a function of process variations. Further, generator 88 can be maintained temperature independent so that the pulse width of the output pulses remains constant.

Figure 4:
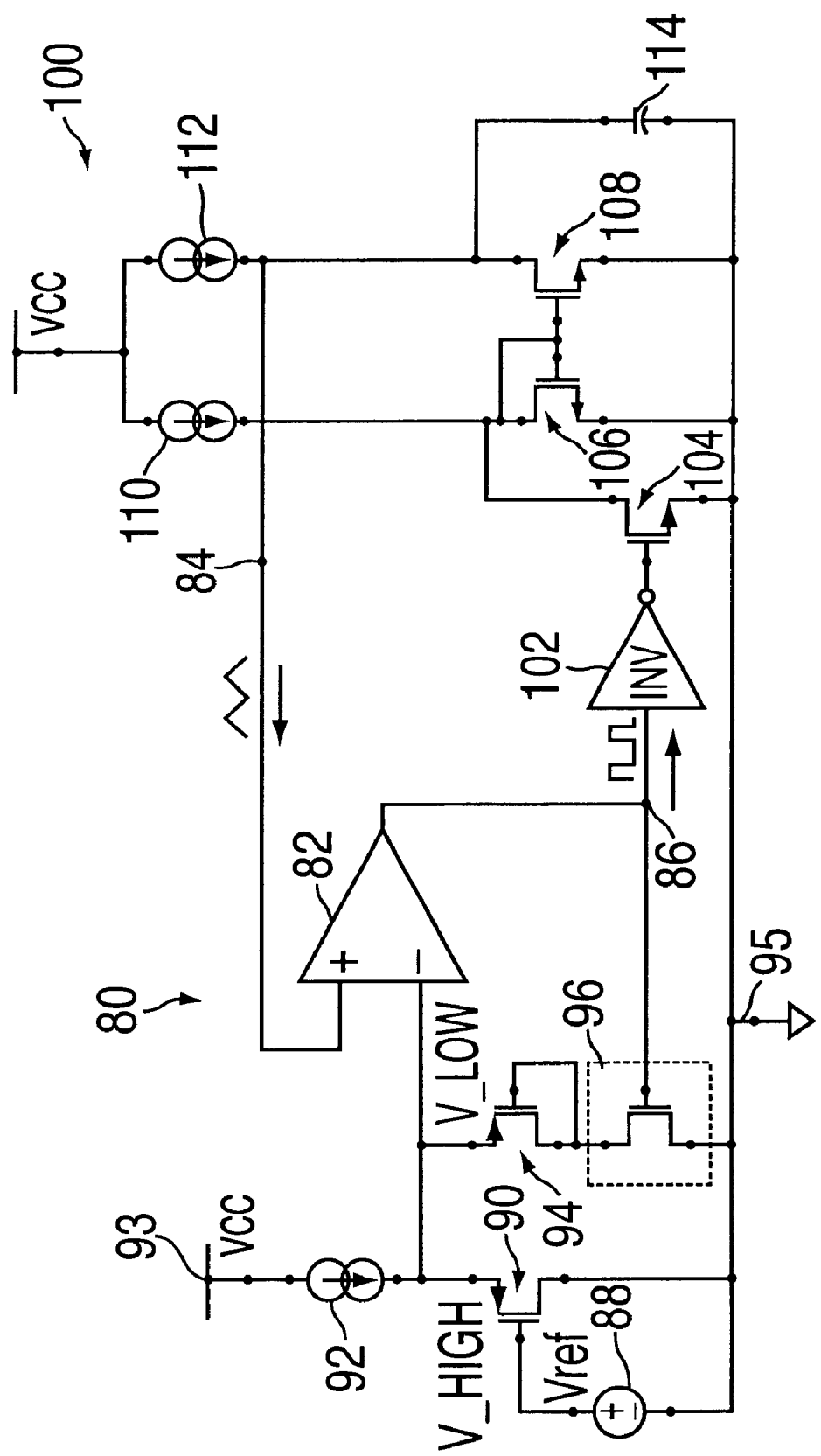
FIG. 4 is a schematic diagram of the oscillator of the present invention including a saw generator connected therewith.

Turning now to FIG. 4 there is shown controller oscillator 80 in combination with saw tooth generator 100. Saw tooth generator 100 is illustrated as an example and is well known. In fact, saw tooth generator 100 could be used with the prior art systems show in FIGS. 1 and 2.

Saw tooth generator 100 includes an inverter 102 in which its input is coupled to the output 86 of controller oscillator 80. The output of inverter 102 is coupled to the input of NMOS transistor 104 the source electrode of which is returned to a ground reference potential 95. The drain of transistor 104 is coupled to the drain of NMOS transistor 106. Transistor 106 is connected as a diode having its drain 10 connected to its gate electrode and also to the gate of NMOS transistor 108 while its source electrode is returned to ground reference potential 95 as is the source electrode of transistor 108. Current sources 110 and 112 are connected from Vcc, supplied at terminal 93, to the drains of transistors 106 and 108 respectively. Capacitor 114 is coupled across the drain and source electrodes of transistor 108.

In operation, with the output of comparator 82 being in a low logic level state, the output of inverter 102 will be in a high logic level state. Thus, transistor 104 is turned on and sinks the current from current source 110 while keeping transistor 106 turned off. While transistor 106 is turned off transistor 108 will also be turned off which allows capacitor 114 to be charged by current source 112. Hence, capacitor 114 continues to charge as long as the output from comparator 82 remains low. When capacitor 114 charges to a voltage equal to $V_{high}$, the output of comparator 82 switches from the low logic level state to a high logic state. Transistor 104 is then turned off and transistors 106 and 108 turn on. Transistor 108 then sinks current and discharges capacitor 114. Capacitor 114 will continue to discharge until the voltage thereacross reaches $V_{low}$ at which the output of comparator 82 goes low and charging begins again. The charging and discharging of capacitor 114 produces the saw tooth signal at input 84 of controller oscillator 80.

Varying the rate of the charging and discharging of capacitor 114 can change the shape of the saw tooth signal produced by generator 100 and thus the shape of the output pulse from controller oscillator 80. The charge and discharge rates can be varied by varying the ratio of the currents supplied from current sources 110 and 112 as well as the ratio of sizes of transistors 106 and 108 as is known.

Hence, what has been described above is a less complex oscillator system when compared with the prior art. The controller oscillator system of the present invention maintains system accuracy requirements while reducing systems costs and being suited for manufacture in integrated circuit form.

What is claimed is:

1. An oscillator for providing a periodic output signal at an output thereof responsive to an applied periodic charging and discharging input signal, comprising:
   a comparator having an inverting and non-inverting input and an output, said output being said output of said oscillator, said non-inverting input receiving the applied input signal;
   a first transistor having a control electrode, first and second electrodes, said first electrode being coupled to the inverting input of said comparator, said second electrode being coupled to a terminal at which is supplied a ground reference potential;
   a current source for supplying a current at an output thereof, said output being coupled to said first electrode of said first transistor;
   a second transistor having a control electrode, a first electrode coupled to said inverting input of said comparator, and a second electrode connected to its control electrode;
   a third transistor having a control electrode coupled to said output of said comparator, a first electrode coupled to said terminal and said second electrode coupled to said second electrode of said second transistor; and
   a voltage source for providing a reference voltage to said control electrode of said first transistor.

2. The reference oscillator of claim 1 wherein:
   said first and second transistors are of a first conductivity type; and
   said third transistor are of a second conductivity type.

3. A reference oscillator for producing a periodic signal at an output thereof having first and second level states responsive to an applied input signal charging and discharging between first and second voltage references, comprising;
   a comparator having non-inverting and inverting inputs and an output, said non-inverting input receiving said input signal, and said output of said comparator being coupled to the output of the oscillator;
   a current source having an output coupled to said inverting input of said comparator;
   a first circuit coupled to said current source at said output thereof for providing the second voltage reference at said inverting input of said comparator such that said comparator output is at the first level state as the applied input signal charges from the first voltage reference to the second voltage reference; and
   a second circuit for providing the first voltage reference at said inverting input of said comparator when the output of the comparator switches to the second level state responsive to the magnitude of the applied input signal becoming equal to the second voltage reference at which time the magnitude of the applied input signal begins to discharge and said second circuit is coupled in parallel with said first circuit.

4. The reference oscillator of claim 3 wherein said first circuit includes:
   a voltage source for providing a reference voltage at an output thereof; and
   a first transistor of a first conductivity type having a control electrode coupled to said output of said voltage source, a first electrode coupled to said inverting input of said comparator, and a second electrode coupled to a terminal at which is provided the second voltage reference.

5. The reference oscillator of claim 4 wherein said second circuit includes:

a second transistor of said first conductivity type having a first electrode coupled to said inverting input of said comparator, a second electrode and a control electrode coupled to said second electrode; and a switch coupled to said output of said comparator for coupling said second transistor in parallel with said first transistor whenever the output of said comparator is at the second level state.

6. The reference oscillator of claim 5 wherein said switch comprises a third transistor of a second conductivity type having a control electrode coupled to said output of said comparator, a first electrode coupled said terminal, and a second electrode coupled to said second and control electrodes of said second transistor.

7. A method for producing a periodic signal having first and second logic states, comprising the steps of:

providing a signal that varies between a first voltage reference and a second voltage reference;

providing a voltage reference of a predetermined magnitude;

generating said second voltage reference from said voltage reference, the second voltage reference having a magnitude greater than said magnitude of said voltage reference by a predetermined voltage;

generating said first voltage reference the magnitude of which is substantially equal to said predetermined voltage; and comparing said signal to said first and second voltage references to produce the periodic signal.

* * * * *